United States Patent [19]
Siegle et al.

[11] 3,930,975
[45] Jan. 6, 1976

[54] SPUTTERING METHOD FOR PRODUCING SOLDER-FAST COPPER LAYERS

[75] Inventors: Gert Siegle, Hildesheim; Hans Lutz; Helmut Adam, both of Stuttgart; Erhard Gössl, Gerlingen, all of Germany

[73] Assignee: Robert Bosch G.m.b.H., Stuttgart, Germany

[22] Filed: Oct. 10, 1974

[21] Appl. No.: 513,548

[30] Foreign Application Priority Data
Oct. 27, 1973 Germany............................ 2353942

[52] U.S. Cl................................... 204/192; 29/590
[51] Int. Cl.²................. C23C 15/00; H01L 21/283
[58] Field of Search............................ 204/192, 298

[56] References Cited
UNITED STATES PATENTS

| | | | |
|---|---|---|---|
| 3,720,541 | 3/1973 | King................................ | 204/192 X |
| 3,766,041 | 10/1973 | Wasa et al. ......................... | 204/192 |
| 3,798,146 | 3/1974 | Wan et al. .......................... | 204/192 |
| 3,835,007 | 9/1974 | Ferat et al. ......................... | 204/192 |

OTHER PUBLICATIONS

Berry et al. "Thin Film Technology," Van, Nostrand Reinhold, N.Y. (1968), pp. 210–211.

*Primary Examiner*—T. Tung
*Assistant Examiner*—Aaron Weisstuch
*Attorney, Agent, or Firm*—William R. Woodward

[57] ABSTRACT

Copper is sputtered onto a substrate to make a solder-fast contact layer by carrying out the sputtering in a discharge of a monatomic gas containing 0.5 to 16% of air, nitrogen or oxygen which reduces the conductivity of the copper layer, but makes it resistant to alloying with a solution in solder, to an extent comparable with the results obtained by the provision of intermediate diffusion barrier layers. Best results are obtained in an argon discharge in the presence of an admixture of nitrogen or air between 2 and 4% by volume. The solder-wetting properties are not impaired.

15 Claims, No Drawings

SPUTTERING METHOD FOR PRODUCING SOLDER-FAST COPPER LAYERS

This invention concerns a method of cathodic sputtering a solder-resistant copper layer on a substrate.

Simple thin film circuits are produced by depositing a set of layers on a substrate comprising a layer with a certain resistance constituting electrical components and a contacting layer of good electrical conductivity. The resistance layer contains preferably nichrome (Ni Cr), tantalum nitride ($Ta_2N$), tantalum oxide-nitride and tantalum-aluminum mixtures. Insofar as connections are to be made to the contacting layer by soldering, the contact layer must not dissolve in solder during the time necessary for the soldering operation, which is to say the contacting layer must be solder-resistant. This result is obtained, in the case of known contacting layers, by producing pure copper layers in sufficient layer thickness, which may be done with noble metals as well as with copper, or, on the other hand, by providing so-called diffusion barriers under the copper layer, in the form of additional layers of iron, nickel, platinum, tungsten or the like. The alloying of the solder right through the layer is particularly difficult to control if tin-rich solder, for example, eutectic lead-tin solder, is used. The production of sequences of different layers, and likewise the production of thick layers, is expensive and frequently connected with unusual processing and finishing difficulties. Among these difficulties are control of adhesion of the layers, control of the phosphorus content of nickel layers deposited by an electroless process and the danger of oxidation of iron layers.

It is an object of the invention to provide copper layers that are inexpensive and as thin as possible, particularly for thin film circuits, on a substrate body, in such a way that the alloying tendency of the copper is reduced to such an extent that alloying does not occur completely through the layer when connections are soldered to the terminals or contacts.

SUBJECT MATTER OF THE PRESENT INVENTION:

Briefly, the gas sputtering medium, preferably consisting mainly of argon, contains another gas which is partly trapped in the copper layer and reduces the conductivity of the deposited copper without reducing the conductivity relative to massive pure copper. Air, nitrogen and oxygen have been found particularly desirable as additives for the sputtering gas. The favorable volumetric proportion of these additives is not the same for all gases and varies between 0.5 and 16%; the best results were, however, obtained with additives comprising between 2 and 4 % by volume of the sputtering gas.

With the process of this invention, highly solder-fast copper layers are obtained that on the one hand are very thin, being of the order of magnitude of about 0.5 $\mu$m, that are capable of functioning without alloying additions and without intermediate layers functioning as diffusion inhibitors. Soldering times of 30 seconds at 210°C., using eutectic composition Pb-Sn solder, are easily usable without any complications.

The copper layers of this invention are produced by cathodic sputtering in a low-pressure gas discharge in which positive gas ions bombard the cathode and dislodge particles of cathode material which are projected onto the substrate at or on the anode. Direct cathodic sputtering by a diode apparatus produces shiny metallic layers. The pressure for such a discharge is, as is known, in the range between approximately $10^{-2}$ and $5\times10^{-1}$ torr. The gas consists principally of a monatomic gas, preferably a noble gas, usually argon. The discharge gas, which may be referred to as the sputtering medium, is provided with an addition of nitrogen ($N_2$), oxygen ($O_2$) or a mixture of oxygen and nitrogen such as air. The production of the layers thus carried out reduces the conductivity of the deposited copper, compared with pure solid copper, by a factor of 5 to 7 as a result of gas inclusions. This factor can fall to a value of 2.5 and can rise as high as the value 15. For direct cathodic sputtering in a diode apparatus, the sputtering potential runs from 3 to 8 kV, and is preferably made 6 kV, while the current density has a value of the order of 1 $mAcm^{-2}$. Gas flow through the discharge vessel can be varied between 0.1 and 3 liters per hour (as reduced to 20°C. and 1 atm.) and is to be varied in accordance with the size of the cathode that is used, the larger the cathode the greater the flow. As determined by experiment, the best layers are obtained with a nitrogen or air additive quantity of between 2 and 4 volume %. A layer thickness of the order of 0.5$\mu$m is readily produced.

These values set forth an advantageous set of sputtering parameters, which, nevertheless, can be modified by taking appropriate account of their interdependence. The rate of sputtering drops noticeably only with very high oxygen content, beginning above about 10% by volume.

EXAMPLE I — LAYER PRODUCTION

Copper was sputtered in a diode apparatus in a discharge atmosphere of 97% argon and a 3% admixture of air at $5\times10^{-2}$ torr, under a potential of 6 kV and at a current density of 1.2 $mAcm^{-2}$. The experimental apparatus, in the tests set up giving these results, had a spacing between cathode and substrate of 5.5 to 6 cm, for the case of a cathode surface of 826 $cm^2$ and a gas feed-through, reduced to normal conditions, of 1 liter per hour.

The layer thickness of the sputtered copper layer was of the order of 0.5 $\mu$m.

The solder-fastness of the copper layer can be tested as follows:

EXAMPLE II — TEST PROCEDURE

A circuit pattern is produced with contact patches measuring 1.5 × 1.5 $mm^2$ on a substrate provided with a resistance layer and a conducting layer. The substrate is dipped into a liquid flux and then put for 6 seconds in liquid lead-tin solder containing 4% by weight of silver. Thereafter, the substrate is cooled outside of the solder bath back down to room temperature. This procedure is repeated a number of times until the solder-covered surface on the contact spot becomes smaller, usually beginning from the edges inward. The number of dip operations that must be made until the copper layer is alloyed through is a measure of the solder-fastness.

Experimental procedures of this type have shown that copper layers prepared in accordance with the above-specified parameters show an improvement compared to copper layers made with the greatest possible purity, even when the air content of the sputtering gas is as small as 0.5% by volume. The solder-resistance in these cases remains only slightly below that which is obtained with much greater expense by the provision of intermediate iron layers of 2,000 A thickness. For practical applications, the copper layers produced according to the much simpler, more reliable and trouble-free process of the present invention are fully satisfactory. The production of sputtered copper layers, according to the present invention, possesses a number of advantages compared to known methods. The deposition of rates of sputtered copper are higher than the rates of deposition of layer materials that are suitable for use as diffusion barriers. In consequence there is a significant increase in manufacturing capacity for the sputtering equipment. Corrosion problems, furthermore, such as are present when intermediate iron layers are provided in the copper, are entirely absent in the copper layers produced in accordance with the invention. The adhesion of the copper layers on an underlying layer of tantalum oxide-nitride, moreover, is improved. The sputtering equipment can be substantially simplified, particularly because of the simple construction of the cathodes. Variations in the resistance of the first layer can be held constant simply by keeping the sputtering process parameters constant, with the result that various resistivity levels can be obtained in a predictable fashion.

We claim:

1. Method of producing a solder-fast thin film circuit unit having copper layer connection paths and contact patches which comprises the step of cathodically sputtering copper onto a substrate in a circuit pattern including contact patches, said sputtering being carried out in a gas discharge medium consisting of a monatomic gas with an admixture of between 0.5 and 16% by volume of a normally predominantly diatomic atmospheric gas under conditions in which said atmospheric gas is taken up in part in said copper layer and reduces the conductivity of the deposited copper to between 7 and 40% of the conductivity of a pure copper layer, whereby contact patches capable of being soldered and of withstanding soldering are produced.

2. Method as defined in claim 1 in which said substrate is a substrate which has been previously provided with constituting a surface layer a resistance to electrical conductivity.

3. Method as defined in claim 2 in which said copper layer is sputtered without any intermediate sputtering of an interleaved layer functioning as a diffusion barrier.

4. Method as defined in claim 1 in which said monatomic gas is argon and in which said atmospheric gas is nitrogen.

5. Method as defined in claim 1 in which said monatomic gas is argon and said atmospheric gas is oxygen.

6. Method as defined in claim 1 in which said monatomic gas is argon and said atmospheric gas is air.

7. Method as defined in claim 1 in which the amount of said admixture of an atmospheric gas is between 2 and 4% by volume.

8. Method as defined in claim 1 in which the copper sputtering step employs a pure copper target cathode.

9. Method as defined in claim 1 in which sputtering is carried out under a potential between 3 and 8 kV. in a diode apparatus.

10. Method as defined in claim 9 in which said potential is approximately 6 kV.

11. Method as defined in claim 1 in which during the cathode sputtering step a gas flow through the sputtering vessel is provided of a magnitude, reduced to normal conditions, between 0.1 and 3 liters per hour.

12. Method as defined in claim 11 in which said gas flow is approximately 1 liter per hour and the cathode surface has an area of approximately 1,000 $cm^2$.

13. Method as define in claim 1 in which the sputtering step is carried out for such a period that the copper layer produced has a thickness of about 0.5 $\mu$m.

14. Method as defined in claim 1 in which monatomic gas is argon and said atmospheric gas is a mixture of oxygen and nitrogen.

15. Method of producing a solder-fast thin film unit having a resistive layer and a copper layer thereon which comprises the step of cathodically sputtering copper onto a substrate which has previously been provided with a surface layer of a material selected from the group which consists of tantalum nitride, tantalum oxynitride and mixtures of tantalum and aluminum, said step of sputtering copper being carried out in a gas discharge medium consisting of a monatomic gas with an admixture of between 0.5 and 16% by volume of a normally predominantly diatomic atmospheric gas under conditions in which said atmospheric gas is taken up in part in said copper layer and reduces the conductivity of the deposited copper to between 7 and 40% of the conducitivity of a pure copper layer.

* * * * *

UNITED STATES PATENT AND TRADEMARK OFFICE
CERTIFICATE OF CORRECTION

PATENT NO. : 3930975
DATED : January 6, 1976
INVENTOR(S) : (1) Gert SIEGLE; (2) Hans LUTZ; (3) Helmut ADAM; (4) Erhard GOSSL It is certified that error appears in the above-identified patent and that said Letters Patent are hereby corrected as shown below:

In the third line of claim 2 (col. 3, line 42) delete the word "constituting" where it stands and insert it after the word "layer".

Signed and Sealed this thirtieth Day of March 1976

[SEAL]

Attest:

RUTH C. MASON
Attesting Officer

C. MARSHALL DANN
Commissioner of Patents and Trademarks